United States Patent [19]

Muth

[11] Patent Number: 4,507,622

[45] Date of Patent: Mar. 26, 1985

[54] OSCILLATOR UTILIZING INDUCTIVE PARAMETER OF TRANSISTOR

[75] Inventor: Robert N. Muth, East Northport, N.Y.

[73] Assignee: Hazeltine Corporation, Commack, N.Y.

[21] Appl. No.: 445,337

[22] Filed: Nov. 29, 1982

[51] Int. Cl.³ .............................................. H03B 7/00
[52] U.S. Cl. .................................. 331/115; 331/36 C; 331/117 R; 333/214
[58] Field of Search ............... 331/115, 117 R, 177 V, 331/36 C; 333/214, 217

[56] References Cited

U.S. PATENT DOCUMENTS 2,769,908 11/1956 Stansel ................................. 331/115
2,820,145 1/1958 Wolfendale ........................ 331/115
3,581,122 5/1971 Gaunt ................................. 330/94 X
3,693,105 9/1972 Kleinberg ....................... 331/115 X Primary Examiner—Eugene R. LaRoche
Assistant Examiner—Robert J. Pascal
Attorney, Agent, or Firm—E. A. Onders; F. R. Agovino

[57] ABSTRACT

An oscillator having sufficient accuracy and precision for use in aircraft microwave-landing systems is constructed without the use of an external inductor. A resonant tank circuit comprising both capacitance and inductance is attained by the use of inductance found internally in the base-emitter junction of a transistor suitably biased for operation at the frequencies of a microwave landing system. A transistor having greater-than-unity gain in the oscillation-frequency range is selected for which the angle of the reflection coefficient of the base-emitter junction is positive in the oscillation-frequency range.

11 Claims, 2 Drawing Figures

OSCILLATOR UTILIZING INDUCTIVE PARAMETER OF TRANSISTOR

BACKGROUND OF THE INVENTION

1. Field of the Invention

This invention relates to transistor oscillators and, more particularly, to a high frequency, stable oscillator utilizing a transistor having an input reflection coefficient which is inductive at high frequencies and having a gain at high frequencies which is sufficient for oscillation.

2. Description of the Prior Art

Stable oscillators are frequently employed in equipment which must be insensitive to vibration. Such oscillators are used in microwave landing systems (MLS) for the guidance of aircraft. MLS receivers installed in aircraft assist in guiding the aircraft during landing by interpreting MLS signals provided by an MLS ground station located at the airport. The MLS receiver must generate an accurate oscillation frequency to insure reception of the MLS signals of the MLS ground station.

In the prior art, two forms of oscillators have been employed, one utilizing a resistive-capacitive feedback circuit, and the other utilizing a resonant tank circuit comprising a capacitor and an inductor. At high frequencies i.e. (400 MHz) the resistive-capacitive circuit is disadvantageous in that the loop gain may be too low to sustain oscillation, and in that if oscillation is obtained, the circuit Q is too low to hold the frequency with the desired accuracy. On the other hand, a tank circuit may not be utilized because it is vibration sensitive. Small dimensional changes appear in the inductor at the vibration frequencies with a consequential modulation of the oscillation frequency. The magnitude of the frequency dispersion due to such vibration degrades the performance of the oscillator and, consequently, the landing system.

Thus, a problem exists in that while the inductor is most useful in a high-Q tank circuit for accurately tuning the oscillator, the susceptibility to vibration results in an undesirable frequency modulation with a consequential degradation in the operation of the microwave landing system.

SUMMARY OF THE INVENTION

The foregoing problem is overcome and other advantages are provided by a transistorized oscillator employing resonance between inductive and capacitive elements for accurate frequency tuning without the use of an inductor external to the transistor of the oscillating circuit. In accordance with the invention, the scattering matrix for the grounded-emitter configuration of a transistor shows that, in some transistors, the reflection coefficient for the base-emitter terminal pair can be made inductive at frequencies for which the gain of the transistor is greater than unity. The reflection coefficient is represented mathematically by a complex number having both a resistive and reactive component. The resistive component is negative in the range of frequencies where oscillation is desired, the negative resistance indicates that a circuit employing the transistor can be made to oscillate at the desired frequency. The angle of the reflection coefficient is positive in the desired frequency range, thus indicating that the base-emitter junction of the transistor will function as an inductor.

In accordance with the invention, the oscillator comprises a capacitor which is connected to a terminal of the base-emitter junction of the transistor for resonating with the inductance thereof at the frequency of oscillation. Advantageously, the capacitor is electronically tunable to permit electronic selection of the oscillation frequency. Such electronic tuning may be attained by use of a varactor for the foregoing capacitor. In addition, a bias voltage is impressed across the base-emitter junction to insure that the inductive function occurs within the desired frequency range.

BRIEF DESCRIPTION OF THE DRAWINGS

The foregoing aspects and other features of the drawings are explained in the following description taken in connection with the accompanying drawings wherein.

For a better understanding of the present invention, together with other and further objects, reference is made to the following description, taken in conjunction with the accompanying drawings, and its scope will be pointed out in the appended claims.

DESCRIPTION OF THE PREFERRED EMBODIMENT

Figure 1:
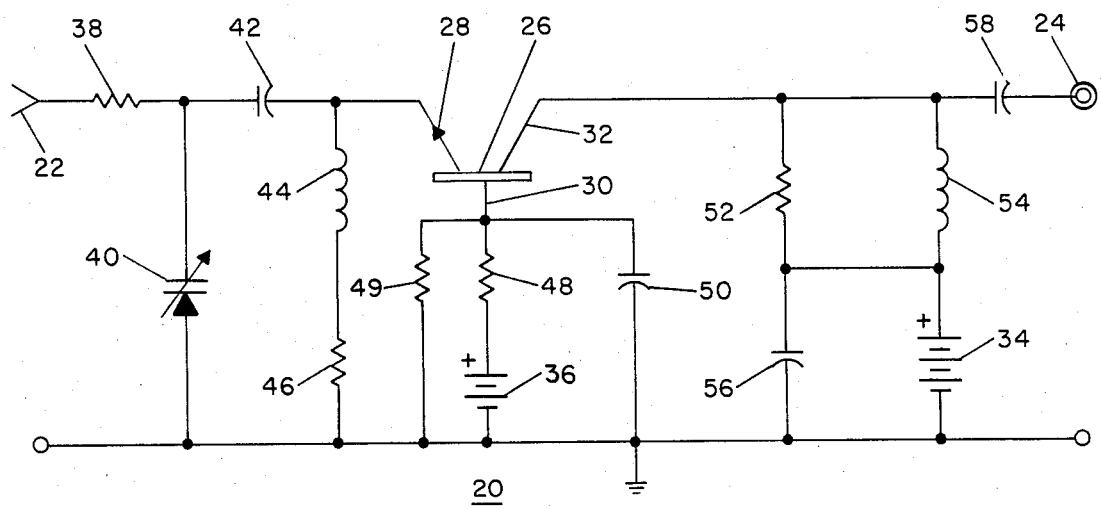
FIG. 1 is a schematic diagram of the oscillator of the invention.

Referring now to FIG. 1, there is shown the circuit of an oscillator 20 constructed in accordance with the invention. The oscillator 20 has an input terminal 22 by which an external voltage is applied for selection of the oscillation frequency, the oscillator 20 including an output terminal 24 from which the output signal is taken. The output signal has a sinusoidal waveform at the desired frequency of oscillation. The oscillator 20 comprises a transistor 26 having an emitter terminal 28, a base terminal 30 and a collector terminal 32. Electric power for the oscillator 20 is provided by a suitable source of electric power such as a battery 34 connected in the collector circuit of the transistor 26. Bias voltage is applied to the base terminal 30 of transistor 26, for example by a battery 36.

The input, or emitter, circuit of the oscillator 20 comprises a resistor 38, a varactor 40, a capacitor 42, an RF (radio frequency) choke 44 and a resistor 46. The bias, or base, circuit comprises two resistors 48 and 49 and a capacitor 50. The output, or collector, circuit comprises a resistor 52, and RF choke 54 and capacitors 56 and 58.

Figure 2:
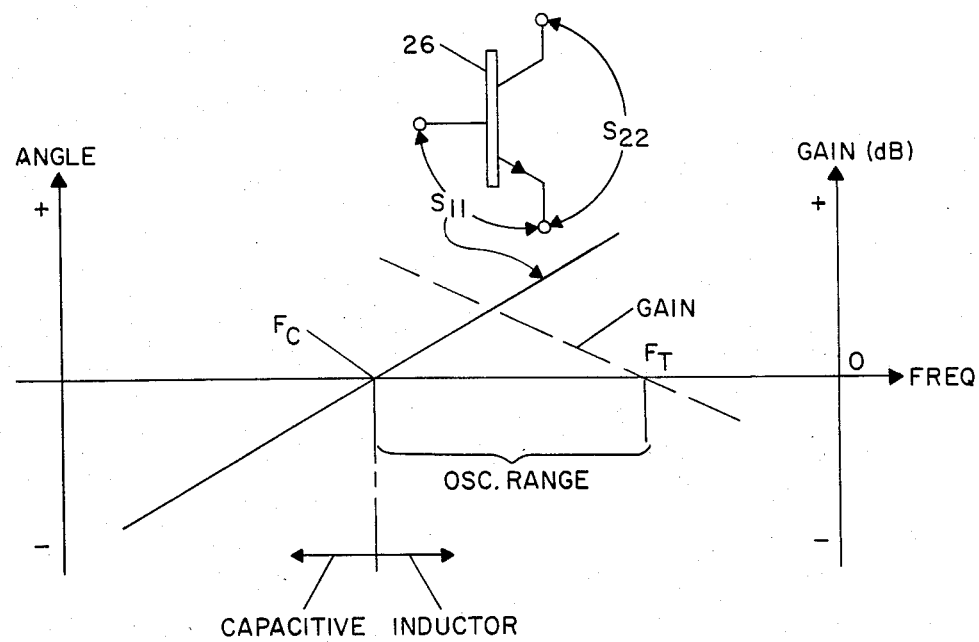
FIG. 2 is a graph of the reflection coefficient and gain as a function of frequency for the transistor of the oscillator circuit of FIG. 1.

With reference also to FIG. 2, the circuit of the oscillator 20 operates as follows. The quiescent value of base current is established by the series connection of the resistors 48 and 49, the resistor 46, the choke 44, the battery 36 and the base-emittter junction of the transistor 26. The quiescent value of the collector voltage is established by the voltage of the battery 34 minus the voltage drop across the choke 54, which voltage drop may be regarded as neglibibly small at low frequency. Both the chokes 44 and 54 are constructed of ferrite material and appear, substantially, as an open circuit at higher frequencies, such as at the frequency of oscillation. Capacitor 58 serves as an output coupling capacitor offering essentially zero impedance to the output signal at the oscillation frequency, while attenuating signals at lower frequencies. Capacitors 50 and 56 are of similar capacity to the capacitor 58 and serve as bypass capacitors. Capacitor 50 functions to short high frequency signals, in the range of the oscillation frequency, from the base terminal 30 to ground to bypass the resistors 48 and 49 and the battery 36. Similarly, the connection of the capacitor 56 from the junction of the choke 54 and the battery 34 to ground bypasses battery 34. The connection of resistor 52 between the collector terminal 32 and capacitor 56 provides a resistive loading to the output signal at the oscillation frequency which in turn stabilizes the collector impedance.

Varactor 40 is serially connected with resistor 38 between the input terminal 22 and ground. Resistor 38 isolates varactor 40 from the external driving voltage from a suitable well known source (not shown) between input terminal 22 and ground. The capacitance of varactor 40 varies in accordance with the magnitude of the voltage applied to the terminals of varactor 40, the capacitance resonating with the inductance provided by the base-emitter junction of transistor 26. Thereby, the voltage applied between input terminal 22 and ground selects the frequency of oscillation.

The capacity of capacitor 42 is selected together with the capacity of the varactor diode 40 to set the frequency range of the oscillator. Capacitor 42 blocks DC (direct current) voltage appearing across the series combination of choke 44 and resistor 46 from the DC voltage appearing across varactor 40. Since choke 44 acts as an open circuit to the high frequency signals, while acting substantially as a short circuit to DC signals, the choke decouples resistor 46 from signals at the oscillation frequency without affecting the bias current passing through the base-emitter junction and the resistor 46.

With respect to the graph of FIG. 2 dealing with the reflection coefficients of the scattering matrix of the grounded-emitter configuration of a transistor such as transistor 26, the angle of the input reflection coefficient $S_{11}$ is seen to rise as a function of frequency from a negative value to a positive value, the angle being zero at the crossover frequency $F_c$. The negative values of the angle show the range of frequencies over which the base-emitter junction of the transistor 26 acts as a capacitor, while the positive values of the angle show the range of frequencies over which the base-emitter junction acts as an inductor. The transistor gain, shown as an exemplary logarithimic trace in dB (decibles), falls off with increasing frequency to a value of zero dB at the transition frequency $F_T$.

Many transistors, especially those used at high frequencies, have crossover frequencies in the gigahertz range and are not suitable for UHF oscillators. Other transistors used in low frequency work may not exhibit a crossover frequency Fc at all of may exhibit a crossover frequency Fc in a range wherein the gain has fallen substantially so as to preclude their use as oscillators. Therefore, transistor 26 must have a crossover frequency Fc which occurs below its transistion frequency $F_T$ so that sufficient gain can be realized for oscillation. Accordingly, such high-frequency transistors would not provide the oscillatory range, shown in the graph, wherein the base-emitter junction exhibits the inductive properties while the gain is greater than unity for sustaining oscillation. Thus, it becomes apparent that, in the construction of the invention, only transistors exhibiting the relationships shown in the graph are to be utilized. It is also noted that the specific range, in the graph, over which the oscillations are to occur is dependent on the base-emitter bias voltage and current so that some adjustment of the frequency range can be accommodated by adjustment selection of the values of the voltage of battery 36 and of the resistance of resistors 48 and 49.

For oscillations at approximately 400 MHz (megahertz), transistor type 2N3866 is advantageously employed in oscillator 20, this transistor becoming inductive with a crossover frequency $F_c$ of 250 Mhz and a transistion frequency $F_T$ of approximately 800 MHz at bias conditions of +15 volts and 50 ma (milliamperes) of base current. Other bias conditions are also possible and yield similar results. The device itself in the present application is biased at +12 volts and 10 milliamperes. The +12 volt bias is attained by setting the battery 36 at 12 volts. Battery 34 may also be set at 12 volts for providing power to oscillator 20. The corresponding parameter values for other elements of the oscillator circuit are, by way of example, as follows. The values of the resistances 38, 46, 48, 49, and 52, in kilohms, are respectively 15, 0.39, 5.6, 4.3 and 0.47. The values of the capacitors 42, 50, 56, and 58, may be set at equal amounts of 33, 100, 100 and 100 picofarads. The chokes 44 and 54 may be made equal at 0.22 microhenries.

Resistor 52 stabilizes the output impedance preventing the output port resistance from becoming negative. This also provides another mode of oscillation.

Thereby, oscillator 20 has been constructed in accordance with the invention to provide for stable oscillations at the frequencies employed in microwave landing systems for aircraft without the introduction of an external inductor for tuning the oscillator circuit, and thereby avoiding frequency modulation induced by vibration of such inductor under conditions of aircraft flight.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An oscillator comprising:
  a. a transistor coupled in a grounded-base configuration, said transistor being characterized by a scattering matrix wherein a reflection coefficient measured across terminals of a base-emitter junction of said transistor has a negative resistive component and a positive angle over a range of oscillation frequency, said range being dependent on a bias electric current impressed through said base-emitter junction, said positive angle of relection coefficient being indicative of inductance within said base-emitter junction in said oscillation frequency range;
  b. Capacitive means coupled across terminals of said base-emitter junction for resonating with said inductance at frequencies within said oscillation frequency range; and
  c. means coupled across terminals of a base-collector junction of said transistor for extracting an output signal of said oscillator at a frequency within said oscillation frequency range.

2. An oscillator according to claim 1 wherein said extracting means includes means for shunting signals at frequencies below said oscillation range away from output terminals of said oscillator.

3. An oscillator according to claim 1 or 2 further comprising biasing means for impressing said bias current through said base-emitter junction.

4. An oscillator according to claim 1 or 2 wherein said capacitive means includes means for varying the capacitance thereof in response to an external electric signal.

5. An oscillator according to claim 4 further comprising biasing means for impressing said bias current through said base-emitter junction.

6. An oscillatory according to claim 5 further comprising means for isolating said external electric signal from said bias current.

7. An oscillator circuit including a transistor having a base-emitter junction and a base-collector junction for oscillating at a desired oscillation frequency, said circuit comprising:
- a. tuning means coupled to said base-emitter junction via a base terminal and an emitter terminal of said transistor;
- b. output means coupled to said base-collector junction via said base terminal and a collector terminal of said transistor;
- c. said transistor being characterized by a scattering matrix wherein the reflection coefficient, as measured between said base terminal and said emitter terminal, has a negative resistive component, said coefficient including a reactive component wherein the angle thereof has a positive value over a range of oscillation frequency indicating inductance within said base-emitter junction;
- d. said tuning means including capacitive means resonating with said indicated inductance of said base-emitter junction;
- e. bias means coupled across said base-emitter junction to activate said transistor within a desired oscillation frequency range; and
- f. means for excluding signals within said oscillation frequency range from said biasing means and for providing an output signal at said desired oscillation frequency.

8. An oscillator circuit according to claim 7 wherein said capacitive means provides capacity which varies in response to an external electric signal.

9. An oscillator circuit according to claim 8 further comprising means coupled between said capacitive means and said biasing means for isolating said external electric signal from said biasing means.

10. An apparatus for oscillating at a given high frequency comprising:
- a. a grounded-base transistor having: a transition frequency greater than said high frequency thereby indicating that said transistor has a gain greater than unity at said high frequency; and a crossover frequency less than said given high frequency thereby indicating that said transistor has a base-emitter junction which is inductive;
- b. capacitive means coupled across terminals of said base-emitter junction for resonating with said inductance at said given high frequency; and
- c. means coupled across a base-collector junction of said transistor for providing an output signal at substantially said high frequency.

11. The apparatus of claim 10 further including means for preventing the base-collector junction resistance from becoming negative.

* * * * *